US006970000B2

(12) United States Patent
Evers et al.

(10) Patent No.: US 6,970,000 B2
(45) Date of Patent: Nov. 29, 2005

(54) MEASURING DEVICE, IN PARTICULAR VECTORIAL NETWORK ANALYZER, WITH SEPARATE OSCILLATORS

(75) Inventors: Christian Evers, Kirchheim (DE); Peter Kraus, Kirchheim (DE); Hermann Boss, Holzkirchen (DE)

(73) Assignee: Rohde & Schwartz GmbH & Co. KG, Munich (DE)

( * ) Notice: Subject to any disclaimer, the term of this patent is extended or adjusted under 35 U.S.C. 154(b) by 77 days.

(21) Appl. No.: 10/681,535

(22) Filed: Oct. 7, 2003

(65) Prior Publication Data

US 2004/0066182 A1    Apr. 8, 2004

(30) Foreign Application Priority Data

Oct. 7, 2002    (DE) .............................. 102 46 700

(51) Int. Cl.[7] .................. G01R 27/06; G01R 23/14
(52) U.S. Cl. ................... 324/638; 324/76.23
(58) Field of Search ............... 324/638, 637, 324/629, 600, 76.23, 327, 436, 88, 135, 158.1, 324/121 R, 601, 613, 646, 650; 73/465; 702/57, 702/65, 75, 76, 127, 183

(56) References Cited

U.S. PATENT DOCUMENTS

| | | | | |
|---|---|---|---|---|
| 5,170,126 A | * | 12/1992 | Wedge et al. ............... | 324/613 |
| 5,191,294 A | * | 3/1993 | Grace et al. ................ | 324/613 |
| 5,633,801 A | * | 5/1997 | Bottman ..................... | 702/65 |
| 5,751,153 A | * | 5/1998 | Bockelman ................ | 324/638 |
| 5,977,779 A | * | 11/1999 | Bradley .................... | 324/638 |
| 6,065,137 A | * | 5/2000 | Dunsmore et al. ........... | 714/37 |
| 6,157,183 A | * | 12/2000 | Bradley .................... | 324/76.23 |
| 6,348,804 B1 | * | 2/2002 | Evers ....................... | 324/646 |
| 6,549,862 B1 | * | 4/2003 | Huang et al. ............... | 702/77 |
| 6,590,399 B1 | * | 7/2003 | Karl et al. ................. | 324/637 |

FOREIGN PATENT DOCUMENTS

DE    198 57 834 A1    10/1999

OTHER PUBLICATIONS

Musch et al., "A Fast Vector Network Analyzer on the Basis of Precise Analogue Frequency Ramps," *Frequenz* 55, 1-2, pp. 47-50 (2001).
Trocheris, "A Network Analyzer With Integrated Aids from Ballmann Electronics," *Microwave HF Magazine—Wireless*, vol. 22, No. 5 and 6, pp. 14, 15 (1996).

\* cited by examiner

*Primary Examiner*—Anjan Deb
*Assistant Examiner*—Hoai-An D. Nguyen
(74) *Attorney, Agent, or Firm*—Caesar, Rivise, Bernstein, Cohen & Pokotilow, Ltd.

(57) ABSTRACT

A measuring device (e.g., a vectorial network analyzer) by means of at least two ports can be connected to a device under test and has associated excitation/receiving units (ERUs), each thereof having one port. At least one ERU has a signal generator, which can apply an excitation signal onto a device under test. Each ERU possesses two receiving apparatuses (each with a mixer in connection with an oscillator signal) to receive the excitation signal, the reflected signal from the associated port or the signal transmitted to the associated port and converts said signal into an intermediate signal. Each ERU exhibits its own oscillator separate from the signal generator, and generates the oscillator signal for the mixer of the receiving apparatus of the ERU, whereby the frequency and/or phase of the oscillator signals, can be adjusted independently of the frequency and/or phase of oscillator signals of the oscillators of other ERUs.

20 Claims, 2 Drawing Sheets

MEASURING DEVICE, IN PARTICULAR VECTORIAL NETWORK ANALYZER, WITH SEPARATE OSCILLATORS

BACKGROUND OF THE INVENTION

The invention concerns a measuring device, especially a vectorial network analyzer. Network analyzers serve for the characterization of a device under test by the measurement of wave values, especially of S-parameters.

If the device under test is, for instance, a 2-port device, then, in a forward measurement, the wave which is projected toward a first port of the device under test, the reflected wave from the first port of the said device under test, as well as the wave which is transmitted through the device under test and exits at the second port, i.e., a forward transmitted wave, are measured. In a reverse measurement, the wave moving toward the second port of the device under test, the wave reflected from the second port as well as the wave transmitted through the device under test and emerging from the first port, i.e. backward-transmitted, are measured. From these measured wave values, various parameters may be computed, for instance, the so-called S-parameters, the reflection coefficient, the amplification or the input/output impedance (respectively). If only the amplitude of the waves are captured, then a scalar network analyzer is identified. If both the amplitude and the phase are determined, then this function is carried out by a vectorial network analyzer.

Such network analyzers are found in a wide variety of types in the state of the technology. A scalar network analyzer has been, for instance, disclosed by DE 198 57 834 A1. The network analyzer made known from this document serves for the measurement of a 2-port object and comprises two excitation/receiving units. The excitation/receiving units are each provided with a signal generator for emitting an excitation signal, so that the port of the device under test, which is connected to the said excitation/receiving unit, is stimulated by an excitation signal. By means of a directional coupler, first the excitation signal is diverted and respectively directed to a first receiving unit. Also, the signal reflected from the corresponding port of the device under test and transmitted through the device under test is likewise diverted and sent to a separate receiving unit.

The excitation frequencies of the signal generators are made adjustable separately for the excitation/receiving units by means of a processor using control signals. Nothing in the said document meets the question as to whether receiving apparatuses operate in accord with the superhetrodyne principle and whether the received signal is converted first into an intermediate frequency state. The necessary mixers are not described and the local oscillators required for this operation are not presented. For a scalar network analyzer, these are indeed not necessary. Most importantly, the document does not state, that these local oscillators necessary for the mixing in the intermediate frequency state are provided separately for the two excitation/receiving units and can be regulated separately from one another. The signal generators are in no way phase-locked or phase lock-controlled, and hence are suitable only for scalar network analysis and not for a vectorial network analysis.

Up to this time, it has not been possible to control the local oscillators of the different ports of the network analyzer in a separated manner, which oscillators are dedicated to the mixer of the receiving apparatuses, in such a way, that the oscillators of the individual ports can operate at different frequencies. This state of art has several disadvantages. Especially serious detriments are found in the so-called, "image-frequency" and in the so-called, "sum-frequency" problem. This subject will later be more closely discussed in detail with the aid of FIGS. 2, 3. The receiving of the image-frequency and sum-frequency, up to this time, could only be suppressed by a complex isolation receiver, which limits the measurement dynamics in the receiving paths, whereby the suppression is not sufficient for all purposes of a measurement. In this respect of insufficiency, where a frequency converting, device under test is involved, the simultaneous measurement of all forward-parameters and all backward-parameters is not possible, since the receiving apparatuses of the various ports can only simultaneously receive at a single frequency. Multi-tone measurements, especially, intermodulational measurements, can only be carried out with additional signal generators.

Consequently, the invention has the purpose of creating a measurement device, especially a vectorial network analyzer, wherein, in particular, the sum-frequence problem and the image-frequence problem are resolved.

SUMMARY OF THE INVENTION

In accord with the invention, each excitation/receiving unit has at least one own oscillator, separate from the signal generator, which produces the oscillator signal for the mixer of the receiving apparatus dedicated to this excitation/receiving unit. With this arrangement, the frequency and/or the phase of the oscillator-signal is adjustable independently of the frequency and/or the phase of the oscillator signal of the oscillators of the other excitation/receiving units. Thereby, it becomes possible, to operate the receiving apparatuses of the different excitation/receiving units with different intermediate frequencies. This has, as will be explained in greater detail with the aid of FIGS. 1 and 3 the advantage that the image-frequency problem and the sum-frequency problem can be resolved.

It is of the great advantage, if each excitation/receiving unit is equipped with not only one, integral, separately adjustable oscillator, but also one integral, likewise separate and adjustable signal generator for the excitation signal. This has an advantage, over the conventional arrangement, which up to now, was limited to a central signal generator, which in turn can be connected by means of a switch matrix with one of the ports. This said advantage is that the said complex switch matrix can be eliminated. In any case, with the switch matrix, in addition, there is always required a switching isolation of some 140 dB, which itself is of some cost. Beyond this, the operational life of the switch matrix is limited by the use of mechanical switches. Further, mechanical switches, because of their relatively long switching time clearly reduce the time of measuring. By the use of electronic switches, then the problem of a deterioration of the signal quality and a debilitation of the measuring dynamics arises. These problems can be set aside by the arrangement of signal generators in all excitation/receiving units. Beyond this, multitone-excitations are possible, in order, for example, to measure the intermodulation-behavior. For this function, two ports of the device under test are connected with one input port of the device under test. Further, the simultaneous measurement of the forward parameter and the backward-parameter is possible, since the excitation in the forward direction and in the backward direction can occur at different frequencies.

The oscillators and signal generators can be connected by control lines, especially by a bus system, and more specifically, by a LAN-bus system, with a central control unit. By this means the frequencies and the phase states of the signal generators and of the local oscillators can be specified.

The individual excitation/receiving units can be inserted as plug-in units in a common housing. Thereby a universal housing for the measurement device can be equipped with a varied number of excitation/receiving units. In this way, for example, a multi-port network analyzer with a variable number of measurement ports can be realized. Furthermore, it is possible, to place the excitation/receiving units proximal to the devices under test and separate from a main housing.

BRIEF DESCRIPTION OF THE DRAWINGS

In the following, the invention is described and explained in greater detail with reference to the drawing of an embodiment. In the drawing there is shown in.

DESCRIPTION OF THE PREFERRED EMBODIMENTS

Figure 1:
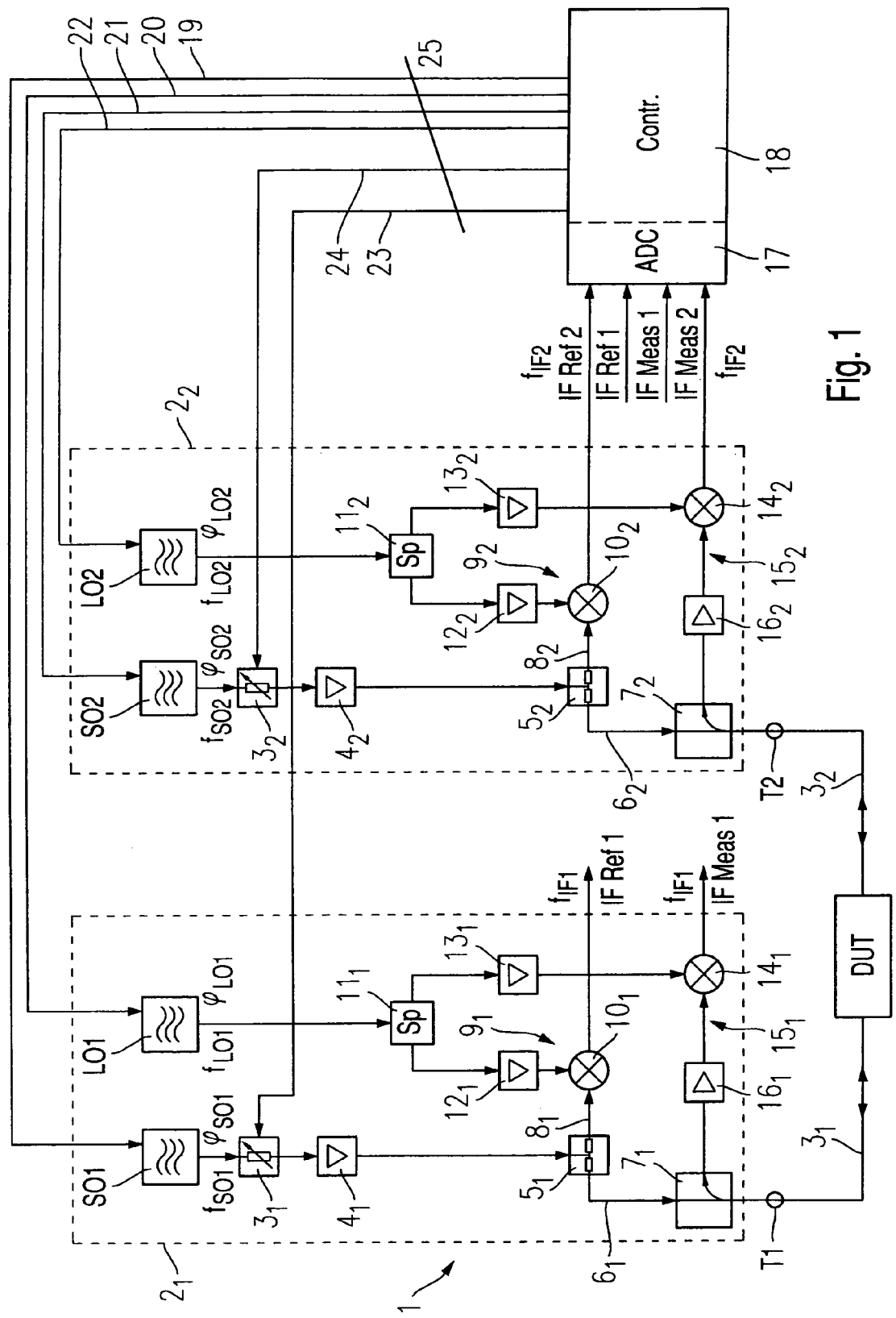
FIG. 1 an embodiment example of the device in accord with the invention in the form of a vectorial network analyzer, FIG. 2 a network analyzer in accord with the state of the technology, for the purpose of elucidating on the problems arising therein from image-frequency and sum frequency, and FIG. 3 the spectrum of the S-parameter $S_{21}$ with a schematic presentation of the action of the image-frequency and the sum frequency, which does not occur in the case of the device in accord with the invention.

FIG. 1 shows an embodiment example of the invented measuring device 1. In the illustrated embodiment, the presentation of a measuring device concerns a vectorial network analyzer. The invented measuring device 1, however, is not limited to application on a network analyzer. Further, what is shown is an embodiment of a 2-port network analyzer. Mention should be made here, that the inventive concept, in the case of vectorial network analyzers is not limited to 2-port network analyzers, but is valid especially where multi-port network analyzers with more than 2-measuring ports is concerned.

In accord with the concept of the invention each port T1, T2 of the measurement device 1, is provided with a separate excitation/receiving unit $2_1, 2_2$. Each excitation/receiving unit $2_1, 2_2$ has a signal generator SO1, SO2, by means of which the device under test DUT can be served with an excitation signal. Either only one of the two signal generators SO1, SO2 can be activated, or even both signal generators SO1, SO2 can actually send an excitation signal.

In the presented application case, the device under test is a 2-port object. This can be a band-pass, an amplifier, a damping circuit or the like. Each of the two ports of the device under test DUT is connected by lines $3_1, 3_2$ with one of the two ports T1, T2 of the measuring device.

The signal generators SO1, SO2 are respectively connected to a variable damping member $3_1, 3_2$ and respectively to an amplifier $4_1, 4_2$ which is followed by a signal splitter $5_1, 5_2$. A signal branch line $6_1, 6_2$ stands in communication over a bridge (directional coupler) $7_1, 7_2$ with its corresponding port T1, T2. The other branch $8_1, 8_2$ is connected with a mixer $10_1, 10_2$ of a first receiving apparatus $9_1, 9_2$ of the respective excitation/receiving unit $2_1, 2_2$. The first receiving apparatus $9_1, 9_2$ thus receives, when the corresponding signal generator SO1, SO2 is active, the excitation signal. Further, an oscillator signal, which is produced by an internal oscillator LO1, LO2 of the respective excitation/receiving unit $2_1, 2_2$ is sent to the mixer $10_1, 10_2$ and is forwarded over a signal splitter $11_1, 11_2$ to an amplifier $12_1, 12_2$.

The same oscillator LO1, LO2 supplies, over the other signal path of the signal splitter $11_1, 11_2$, an amplifier $13_1, 13_2$ and a mixer $14_1, 14_2$ of a second receiving apparatus $15_1, 15_2$ of the respective excitation/receiving unit $2_1, 2_2$. The mixer $14_1, 14_2$ stands in electrical connection through an isolation amplifier $16_1, 16_2$ and bridge $7_1, 7_2$, with the corresponding port T1, T2. Thus the second receiving apparatus $15_1$ receives the signal from the corresponding port T1, which signal is transmitted by or reflected from the device under test DUT to the port T1. A signal from the port T2 may also be transmitted to the port T1 from the device under test DUT. Accordingly, the second receiving apparatus $15_2$ of the excitation/receiving unit $2_2$ receives a signal which is transmitted by or reflected from the device under test DUT from the port T1 to the port T2. The mixers $10_1$ and $14_1$ of the first excitation/receiving unit $2_1$ convert the received signal into an intermediate frequency state with an intermediate frequency of $f_{IF1}$, while the mixers $10_2$ and $14_2$ of the second excitation/receiving unit $2_2$ convert the received signal into a second intermediate frequency state with the intermediate frequency of $f_{IF2}$. The intermediate frequencies $f_{IF1}$ and $f_{IF2}$ are not necessarily identical. Therein lies a decisive advantage of the invented improvement.

The intermediate frequency-reference signal IF Ref 1, IF Ref 2, emanating from the mixer $10_1, 10_2$ and the intermediate frequency-measurement signal IF Meas 1, IF Meas 2 emanating from the mixer $14_1, 14_2$, are each conducted to an analog/digital converter 17, which is in communication with a signal evaluation-and-control unit 18. In this arrangement is carried out an evaluation of the reference signals and the measuring signals. The signal evaluation-and-control unit 18 further regulates, by means of control lines 19, 20, 21, and 22 the signal generators SO1 and SO2, as well as the oscillators LO1 and LO2. This regulation is carried out in such a manner, that these each produce first a signal of predetermined frequency, namely, $f_{SO1}, f_{LO1}, f_{SO2}, f_{LO2}$ and second a signal of predetermined phase, namely, $\phi_{SO1}, \phi_{LO1}, \phi_{SO2}, \phi_{LO2}$.

By means of further control lines 23 and 24, the evaluation and control unit 18 is in connection with the adjustable damping members $3_1, 3_2$, so that the signal-amplitude of the excitation signals from the signal generators SO1 and SO2 is controllable. Since the true amplitude of the excitation signal is captured by the intermediate frequency, reference signal IF Ref 1 and IF Ref 2, it becomes possible in this way to form a control loop for the exact regulation of the excitation amplitude.

The control lines 19 to 23 can be consolidated in a bus system 25, especially in a LAN-bus system.

To be in accord with the invention, it is essential that, not as is the case with the state of the technology, a common oscillator be provided for the supply of all the mixers $10_1, 10_2, 14_1, 14_2$, but much more a first integral, separate oscillator LO1 should be provided for the first excitation/receiving unit $2_1$ and a second integral, separate oscillator LO2 should be provided for the second excitation/receiver $2_2$. If this is done, then, oscillator signals sent to first, the mixers $10_1$ and $14_1$ and second, to the mixers $10_2$ and $14_2$ can be differently adjusted in respect to their conditions of frequency and phase. By means of achieving this said different frequency adjustment, the possibility of the intermediate frequency $f_{IF1}$ and $f_{IF2}$ of the two excitation/receiving units $2_1$ and $2_2$ can be chosen separately. This has the advantage, that the problems of image-frequency and sum-frequency, which are found in conventional network analyzers are set aside. This is made clearer in the following with reference to the FIGS. 2 and 3.

By different adjustments of the phases $\phi_{LO1}$, $\phi_{LO2}$, or $\phi_{LSO1}$, $\phi_{SO2}$ transfer time-differences, for instance in the measurement lines $3_1$ and $3_2$, can be compensated for.

Figure 2:
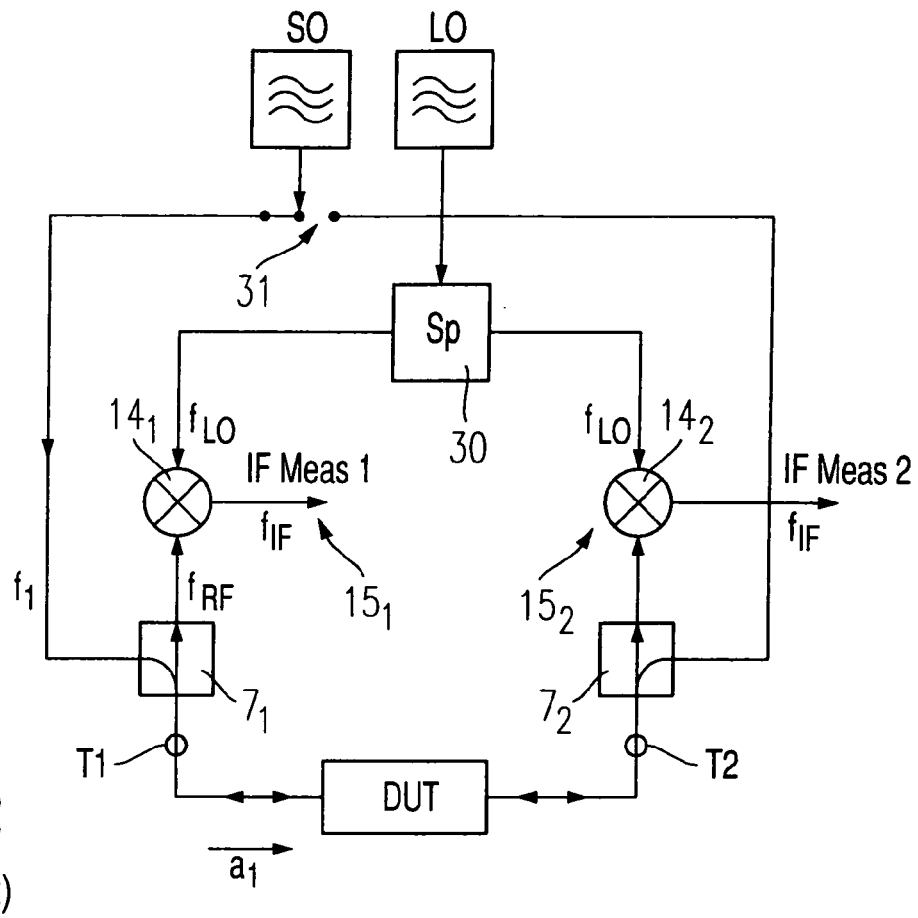
Figure 3:
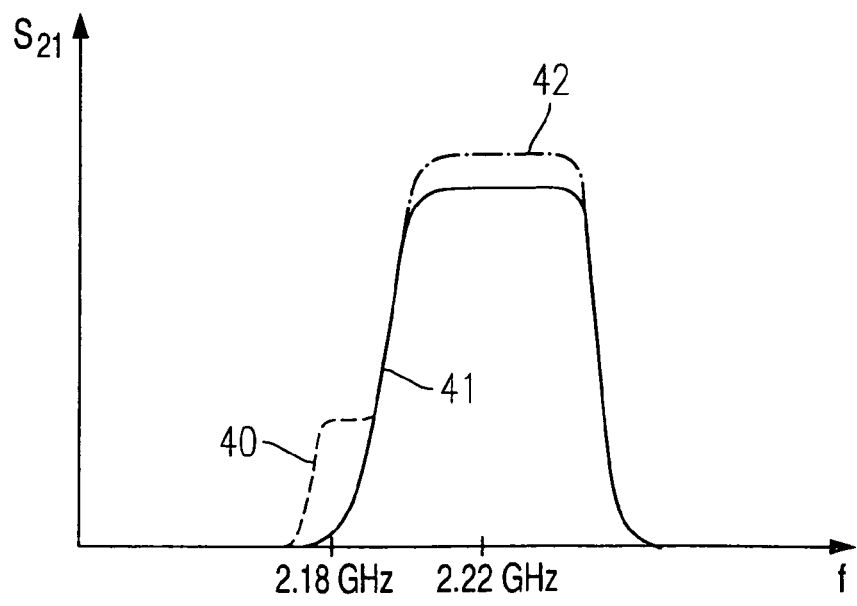

For a better understanding of the image-frequency and sum-frequency problems which have been overcome by the present invention, the framework of this problem is explained in the following with the aid of a conventional network analyzer as shown in FIG. 2. FIG. 3 shows the corresponding spectrum of the S-parameter $S_{21}$ which describes the transmission from port T1 to port T2.

The conventional network analyzer presented in FIG. 2 differentiates itself essentially from the invented network analyzer shown in FIG. 1, in that only a single local oscillator LO is present, which, by means of a signal splitter 30 supplies first, the mixer $14_1$ of the receiver apparatus $15_1$ and second, the mixer $14_2$ of the receiver apparatus $15_2$. There are not, as is the case in FIG. 1, separate oscillators such as LO1 and LO2 for each excitation/receiving unit. The receiving apparatuses $9_1$ and $9_2$ for the reference signal, for the sake of an overall clarity, are not shown in FIG. 2.

A further difference of the conventional network analyzer of FIG. 2, as opposed to the invented network analyzer as presented in FIG. 1, is found therein, in that only a single signal generator SO is provided, which, by means of a toggle switching arrangement 31 is switchable between the port T1 and the port T2. This toggling switching arrangement or reversible matrix contains the disadvantages already described in detail in the above.

The mode of generation of the image-frequency problem is given below.

The assumption is made, that the device under test is a bandpass filter, which has, for example, a pass range near 2.22 GHz. If the wave $a_1$ approaching said bandpass has a frequency of 2.18 GHz, then this is blocked by the bandpass. The wave is then reflected from the bandpass and proceeds nearly undamped as a reflected signal with a frequency of $f_{RF}$ = 2.18 GHz to the mixer $14_1$. At this point it is converted by the oscillator signal, which, for example, could have a frequency of 2.20 GHz, to an intermediate frequency $f_{IF}$, in this example, of 0.02 GHz ($f_{IF}=f_{LO}-f_{RF}$).

However, as a disturbance signal there is created, as is the normal case in superheterodyne receivers, additionally a signal of the image-frequency $f_{LO}+f_{IF}=2\cdot f_{LO}-f_{RF}$. Fundamentally, the image-frequency always lies $2\cdot f_{IF}$ above receiving frequency $f_{RF}$, thus, in the example at 2.22 GHz. This signal exits the mixer $14_1$ in the direction of the port T1 and thus now falls within the pass range of the bandpass which is assumed as the device under test DUT. That is, the signal transmits through the device under test DUT practically undamped. The signal is then received by the mixer $14_2$ as a image-frequency signal, since the oscillator frequency in this example is also 2.20 GHz. However, to this signal a reception frequency of $f_{LO}-f_{IF}$=2.20 GHz–0.02 GHz=2.18 GHz is assigned erroneously.

In the case of measurement of bandpass filters, with conventional network analyzers, there can be an occurrence of a not really present, but only apparent parasitic additional pass range, which lies about $2\cdot f_{IF}$ under the actual pass range. For the above stated example frequencies, this parasitic throughput range is indicated in FIG. 3 by a dotted line 40, while the solid line 41 represents the actual pass range of the bandpass to be measured.

Up to this time, this set of problems was countered by means of a high backward-damping of the isolation amplifiers $16_1$, $16_2$ shown in FIG. 1. The costs and complexities involved with this solution are, however, very great.

In the case of the invented network analyzer as presented in FIG. 1, the intermediate frequencies IF Meas 1 and IF Meas 2 can be separately and differently selected, since separate oscillators L01 and LO2 are available. The frequencies of L01 and LO2, namely $f_{LO1}$ and $f_{LO2}$, can be individually adjusted. If different choices of the intermediate frequencies are made, the transmitted signal through the device under test lies about $2\cdot f_{IF1}$ higher than $f_{RF}$. This value is not within the receiving range of the mixer $14_2$ and as a result is not detected in the signal evaluation. Only when the amount of $f_{LO1}-f_{LO2}$ is less than the band-range of the evaluation-filter which is in the evaluation/control apparatus 18, do the above mentioned image-frequency problems arise.

A further problem of the conventional network analyzer as presented in FIG. 2, is the sum-frequency problem. The attainable measurement dynamic is limited by a noise signal, which is produced by the sum of the receiving signal and the oscillator signal.

The mechanism for the formation of this sum frequency is explained below, once again using the transfer function of a bandpass as an example.

The excitation signal proceeds over the said toggle switch arrangement 31 of FIG. 2 and through the bridge $7_1$ and the port T1 and thus to the device under test DUT. Only a vanishing small portion is transmitted through the blockage range of the said bandpass, which serves here as the device under test DUT. Nearly the entire forward running wave $a_1$ is reflected from the device under test DUT and proceeds over the bridge $7_1$ and on to the receiver mixer $14_1$. At this point, it is converted by means of the oscillator signal with the frequency $f_{LO}$. Among other effects, there is produced as a mix-product the sum frequence $f_{RF}+f_{LO}$ which, with a low level (for example, damped about 30 dB), returns from the port T1 to the device under test. This passes through the device under test, practically without damping and reaches port T2. In the mixer $14_2$, by means of mixing with the parasitic double oscillator frequency $2\cdot f_{LO}$, the said mix-product is converted into the intermediate frequency condition $(2\cdot f_{LO})-(f_{RF}+f_{LO})=f_{LO}-f_{RF}$ whereupon, it makes its exit as a dynamics-limiting disturbing signal. The thereby arising additional sum signal, which distorts the measurement, is shown in FIG. 3, schematically, by means of the dotted-pointed line 42.

Also in this case, this erroneous signal could be countered by means of the isolation amplifiers $16_1$ and $16_2$. In the practice, it becomes evident, that for a sufficient suppression of the interfering signal, in any case, an isolation of more than 70 dB is necessary in the isolation amplifiers $16_1$ and $16_2$, which is exceedingly costly.

The expense of effort and costs in the isolation amplifiers can be likewise substantially reduced by the invented network analyzer, in that the two oscillator frequencies $f_{LO1}$ and $f_{LO2}$ and thus the intermediate frequencies $f_{IF1}$ and $f_{IF2}$ can be differently selected.

The advantages of the invented network analyzer, that is to say, in general the invented measuring device, are not specifically related to the image-frequency problems and the sum-frequency problems. One can also mention, that intermediate frequency-crosstalk at different selections of the intermediate frequencies is avoided.

An important advantage is also, that measurements can be made simultaneously in the forward direction and the backward direction, since the receiving apparatuses $15_1$ and $15_2$ can receive different frequencies at the same time. In this way the time of measuring is substantially reduced.

Further important advantages become evident, in that each excitation/receiving unit is furnished with its own signal generator SO1 or SO2. Thereby the complicated toggle switchovers 31 are eliminated and the speed of measurement can be essentially increased. Since each test port has its own signal generator, then multi-tone measurements and measurements of symmetric devices under test can be easily carried out. Multi-tone measurements serve principally for the detection of intermodulation. In this case, two ports of the network analyzer are connected with the entry of a device under test which possesses one amplifier and the intermodulation can be examined at the output of the device under test.

Also, the so-called "Hot"-S-Parameter measurements are possible. By this is understood the measurements of parameters in the case of a device under test at full output. For instance, the output impedance of an amplifier should be measured in an operational case. For this the amplifier, for example, can be energized in such a manner through the port T1 by an excitation signal, that the amplifier is at its top output capacity. Through the second port T2, the S-parameter $S_{22}$ is measured, from which the output impedance of the amplifier in its full output capacity can be calculated.

The single excitation/receiving units, which, in accord with the invention, are supplied with at least one integral oscillator LO, and advantageously additionally furnished with their own individual signal generator SO, can be designed as completely stand-alone function-components, which only need to be connected over the bus 25 with the control apparatus 18. These function-components can, for example, be made as plug-in devices, and a common housing can be equipped with the number of the required measuring ports with an appropriate number of plug-in sockets.

It should also be mentioned, that the invented network analyzer enables a quick calibration, since the 1-port measurement, necessary for the calibration, can be undertaken in parallel at each port, and the further required 2-port measurements can be made pairwise at the same time at respectively two ports.

The concept in accord with the invention can be extended to an optional number of measuring ports. This concept enables also measurements on bus systems and can be integrated into a tester kit for multiport waver probers.

Emphasis should be given to the fact, that the invented network analyzer makes possible such a degree of precision in the frequency and phase synchronization of the signal generators and oscillators, that a system error-correction can be made. The accuracy is so high, that each optional port can be used as a reference port.

The excitation/receiving units can also be placed as self-operating units, separate from a principal housing and in proximity to the measuring location of the device under test. The excitation/receiving units are fully autocratic and require only that, especially for synchronization purposes, they be connected by means of the bus 25 to the controller 18. This connection can be either a cabled bus system or, particularly recommended, a means of a wireless bus system.

Emphasized once again, is the fact that developments in accord with the invention relate not only to network analyzers, but also may be considered where other measuring devices are involved.

We claim:

1. A measuring device comprising a plurality of excitation/receiving units, wherein each of the excitation/receiving units comprises:
   a port;
   at least one receiving apparatus;
   at least one oscillator; and
   at least one independent signal generator,
   wherein: (a) the measuring device is adapted to be connected by at least two ports to a device under test; (b) the at least one independent signal generator is adapted to apply an excitation signal to the device under test; (c) each receiving apparatus has a mixer connected to an oscillator signal, and is adapted to receive the excitation signal, or the signal reflected from the associated port, or the signal transmitted to the associated port and convert said signal into an intermediate frequency signal; and (d) the at least one oscillator is separated from the at least one independent signal generator and is adapted to produce the oscillator signal for the mixer of the receiving apparatus, whereby a frequency and/or a phase of the oscillator signal is adjustable independently of a frequency and/or a phase of oscillators of other excitation/receiving units.

2. The measurement device in accordance with claim 1, wherein the at least one independent signal generator is adapted to produce an excitation signal having a frequency and/or a phase adjustable independently of a frequency and/or a phase of the excitation signal of signal generators of other excitation/receiving units.

3. The measurement device in accordance with claim 1, wherein the measurement device is a vectorial network analyzer.

4. The measurement device in accordance with claim 1, wherein each excitation/receiving unit comprises: (a) a first receiving apparatus with a first mixer adapted to receive a signal received by a port from the device under test, the signal having been reflected from the device under test or transmitted therethrough; and (b) a second receiving apparatus with a second mixer adapted to receive the excitation signal produced from the signal generator of the excitation/receiving unit.

5. The measurement device in accordance with claim 4, wherein each first mixer and each second mixer of each excitation/receiving unit is supplied with a common oscillator signal from a common oscillator of the excitation/receiving unit.

6. The measurement device in accordance with claim 1, wherein oscillators and/or signal generators of different excitation/receiving units are connected through control lines that are either decentralized among each other, or centralized by way of a control unit, and through these control lines a frequency and/or phase synchronization takes place.

7. The measurement device in accordance with claim 6, wherein the control lines form a bus system.

8. The measurement device in accordance with claim 7, wherein the bus system is a LAN bus system.

9. The measurement device in accordance with claim 1, wherein the excitation/receiving units are plug-in devices adapted to be inserted into a common housing in such variable numbers as are needed in accordance with a number of required ports.

10. The measurement device in accordance with claim 1, wherein the excitation/receiving units, as stand-alone units, are separated from a main housing and placed proximal to the device under test.

11. A measuring device comprising a plurality of excitation/receiving units, wherein each of the excitation/receiving units comprises:
   a port;
   at least one receiving apparatus;
   at least one oscillator; and
   at least one signal generator,
   wherein: (a) the measuring device is adapted to be connected by at least two ports to a device under test; (b) the at least one signal generator is adapted to apply an excitation signal to the device under test; (c) each receiving apparatus has a mixer connected to an oscillator signal, and is adapted to receive the excitation signal, or the signal reflected from the associated port, or the signal transmitted to the associated port and convert said signal into an intermediate frequency signal; (d) the at least one oscillator is separated from the signal generator and is adapted to produce the oscillator signal for the mixer of the receiving apparatus, whereby a frequency and/or phase of the oscillator signal is adjustable independently of a frequency and/or phase of oscillators of other excitation/receiving units; and (e) each signal generator is adapted to produce an excitation signal having a frequency and/or phase adjustable independently of a frequency and/or phase of each other excitation signal of other excitation/receiving units.

12. The measurement device in accordance with claim 11, wherein the measurement device is a vectorial network analyzer.

13. The measuring device in accordance with claim 11, wherein said at least one signal generator is at least one independent signal generator.

14. The measurement device in accordance with claim 11, wherein each excitation/receiving unit comprises: (a) a first receiving apparatus with a first mixer adapted to receive a signal received by a port from the device under test, the signal having been reflected from the device under test or transmitted therethrough; and (b) a second receiving apparatus with a second mixer adapted to receive the excitation signal produced from the signal generator of the excitation/receiving unit.

15. The measurement device in accordance with claim 14, wherein each first mixer and each second mixer of each excitation/receiving unit is supplied with a common oscillator signal from a common oscillator of the excitation/receiving unit.

16. The measurement device in accordance with claim 11, wherein oscillators and/or signal generators of different excitation/receiving units are connected througb control lines tat are either decentralized among each other, or centralized by way of a control unit, and through these control lines a frequency and/or phase synchronization takes place.

17. The measurement device in accordance with claim 16, wherein the control lines form a bus system.

18. The measurement device in accordance with claim 17, wherein the bus system is a LAN bus system.

19. The measurement device in accordance with claim 11, wherein the excitation/receiving units are plug-in devices adapted to be inserted into a common housing in such variable numbers as are needed in accordance with a number of required ports.

20. The measurement device in accordance with claim 11, wherein the excitation/receiving units, as stand-alone units, are separated from a main housing and placed proximal to the device under test.

* * * * *